(12) United States Patent
Balseanu et al.

(10) Patent No.: US 7,780,865 B2
(45) Date of Patent: Aug. 24, 2010

(54) METHOD TO IMPROVE THE STEP COVERAGE AND PATTERN LOADING FOR DIELECTRIC FILMS

(75) Inventors: Mihaela Balseanu, Sunnyvale, CA (US); Li-Qun Xia, Santa Clara, CA (US); Mei-Yee Shek, Mountain View, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 692 days.

(21) Appl. No.: 11/693,005

(22) Filed: Mar. 29, 2007

(65) Prior Publication Data

US 2007/0232071 A1  Oct. 4, 2007

Related U.S. Application Data

(60) Provisional application No. 60/788,279, filed on Mar. 31, 2006.

(51) Int. Cl.
 *C03C 15/00* (2006.01)
(52) U.S. Cl. .......... 216/67; 427/532; 427/533; 427/535; 427/569; 427/579; 438/424; 438/692; 438/704; 438/710; 438/724; 216/37
(58) Field of Classification Search .......... 427/579, 427/532, 533, 535, 569, 578; 438/424, 579, 438/692, 704, 724, 710, 778, 763; 216/37, 216/67
See application file for complete search history.

(56) References Cited

U.S. PATENT DOCUMENTS

| | | | |
|---|---|---|---|
| 4,690,746 A * | 9/1987 | McInerney et al. | 204/192.32 |
| 4,980,018 A | 12/1990 | Mu et al. | |
| 5,818,071 A | 10/1998 | Loboda et al. | |
| 5,866,947 A * | 2/1999 | Wang et al. | 257/764 |

(Continued)

FOREIGN PATENT DOCUMENTS

KR   2004-0058955   7/2004

(Continued)

OTHER PUBLICATIONS

Notification of the First Office Action issued Dec. 12, 2008, by the State Intellectual Property Office of the People's Republic of China in Application No. 2007101651423.

(Continued)

*Primary Examiner*—Shamim Ahmed
*Assistant Examiner*—Maki A Angadi
(74) *Attorney, Agent, or Firm*—Patterson & Sheridan, LLP

(57) ABSTRACT

Methods of controlling the step coverage and pattern loading of a layer on a substrate are provided. The dielectric layer may be a silicon nitride, silicon oxide, or silicon oxynitride layer. The method comprises depositing a dielectric layer on a substrate having at least one formed feature across a surface of the substrate and etching the dielectric layer with a plasma from oxygen or a halogen-containing gas to provide a desired profile of the dielectric layer on the at least one formed feature. The deposition of the dielectric layer and the etching of the dielectric layer may be repeated for multiple cycles to provide the desired profile of the dielectric layer.

19 Claims, 6 Drawing Sheets

U.S. PATENT DOCUMENTS

| | | | |
|---|---|---|---|
| 5,895,937 A * | 4/1999 | Su et al. ..................... 257/59 |
| 6,068,884 A | 5/2000 | Rose et al. |
| 6,147,009 A | 11/2000 | Grill et al. |
| 6,159,871 A | 12/2000 | Loboda et al. |
| 6,451,683 B1 | 9/2002 | Farrar |
| 6,465,372 B1 | 10/2002 | Xia et al. |
| 6,486,061 B1 | 11/2002 | Xia et al. |
| 6,514,671 B1 | 2/2003 | Parikh et al. |
| 6,528,432 B1 | 3/2003 | Ngo et al. |
| 6,531,407 B1 | 3/2003 | Huang et al. |
| 6,547,977 B1 | 4/2003 | Yan et al. |
| 6,548,899 B2 | 4/2003 | Ross |
| 6,566,278 B1 | 5/2003 | Harvey et al. |
| 6,566,283 B1 | 5/2003 | Pangrle et al. |
| 6,573,572 B2 | 6/2003 | Farrar |
| 6,582,777 B1 | 6/2003 | Ross et al. |
| 6,583,046 B1 | 6/2003 | Okada et al. |
| 6,583,070 B1 | 6/2003 | Tsui et al. |
| 6,583,489 B2 | 6/2003 | Wang et al. |
| 6,593,247 B1 | 7/2003 | Huang et al. |
| 6,632,735 B2 | 10/2003 | Yau et al. |
| 6,717,265 B1 | 4/2004 | Ingerly et al. |
| 6,743,732 B1 | 6/2004 | Lin et al. |
| 6,762,127 B2 | 7/2004 | Boiteux et al. |
| 6,800,566 B2 * | 10/2004 | Lu et al. ..................... 438/761 |
| 6,825,134 B2 | 11/2004 | Law et al. |
| 6,846,756 B2 | 1/2005 | Pan et al. |
| 6,858,923 B2 | 2/2005 | Xia et al. |
| 6,921,727 B2 | 7/2005 | Chiang et al. |
| 7,163,721 B2 * | 1/2007 | Zhang et al. ................ 427/569 |
| 2002/0061659 A1 * | 5/2002 | Abe ........................... 438/791 |
| 2003/0073321 A1 | 4/2003 | Boiteux et al. |
| 2003/0077857 A1 | 4/2003 | Xia et al. |
| 2003/0077916 A1 | 4/2003 | Xu et al. |
| 2003/0109143 A1 | 6/2003 | Hsieh et al. |
| 2003/0189208 A1 | 10/2003 | Law et al. |
| 2004/0077164 A1 | 4/2004 | Kornegay et al. |
| 2004/0124446 A1 * | 7/2004 | Borger et al. ............... 257/276 |
| 2004/0266216 A1 | 12/2004 | Li et al. |
| 2005/0003676 A1 | 1/2005 | Ho et al. |
| 2005/0026430 A1 | 2/2005 | Kim et al. |
| 2005/0042889 A1 | 2/2005 | Lee et al. |
| 2005/0064698 A1 | 3/2005 | Chang et al. |
| 2005/0070128 A1 | 3/2005 | Xia et al. |
| 2005/0100682 A1 * | 5/2005 | Fukiage et al. .............. 427/569 |
| 2005/0181623 A1 | 8/2005 | Bencher et al. |
| 2005/0230834 A1 | 10/2005 | Schmitt et al. |
| 2005/0255697 A1 | 11/2005 | Nguyen et al. |
| 2006/0046427 A1 | 3/2006 | Ingle et al. |
| 2006/0046519 A1 | 3/2006 | Tsuji et al. |
| 2006/0154493 A1 | 7/2006 | Arghavani et al. |

FOREIGN PATENT DOCUMENTS

| | | |
|---|---|---|
| KR | 2005-0014231 | 2/2005 |
| KR | 2006-0059913 | 6/2006 |
| WO | 99/41423 A2 | 8/1999 |
| WO | WO-2005/020310 | 3/2005 |

OTHER PUBLICATIONS

International Search Report and Written Opinion of the International Searching Authority dated Nov. 21, 2007 (PCT/US 07/65592).

Furusawa, et al., "Oxygen Plasma Resistance of Low-k Organosilica Glass Films" Electrochemical and Solid-State Letters vol. 4 (3), Mar. 2001, pp. G31-G34, Abstract.

Notice to File a Response for Korean Patent Application No. 10-2007-0108170 dated Apr. 13, 2009.

* cited by examiner

METHOD TO IMPROVE THE STEP COVERAGE AND PATTERN LOADING FOR DIELECTRIC FILMS

CROSS-REFERENCE TO RELATED APPLICATIONS

This application claims benefit of U.S. provisional patent application Ser. No. 60/788,279, filed Mar. 31, 2006, which is herein incorporated by reference. Further, this application is related to co-pending U.S. patent application Ser. No. 11/694,856, filed Mar. 30, 2007, and co-pending U.S. patent application Ser. No. 11/668,911, filed Jan. 30, 2007.

BACKGROUND OF THE INVENTION

1. Field of the Invention

Embodiments of the present invention generally relate to a method and apparatus for semiconductor processing. Specifically, embodiments of the present invention relate to a method and apparatus for depositing a conformal dielectric layer.

2. Description of the Related Art

Forming dielectric layers on a substrate by chemical reaction of gases is one of the primary steps in the fabrication of modern semiconductor devices. These deposition processes include chemical vapor deposition (CVD) as well as plasma enhanced chemical vapor deposition (PECVD), which uses plasma in combination with traditional CVD techniques.

CVD and PECVD dielectric layers can be used as different layers in semiconductor devices. For example, the dielectric layers may be used as intermetal dielectric layers between conductive lines or interconnects in a device. Alternatively, the dielectric layers may be used as barrier layers, etch stops, or spacers, as well as other layers.

Dielectric layers that are used for applications such as barrier layers and spacers are typically deposited over features, e.g., horizontal interconnects for subsequently formed lines, vertical interconnects (vias), gate stacks, etc., in a patterned substrate. Preferably, the deposition provides a conformal layer. However, it is often difficult to achieve conformal deposition.

For example, it is difficult to deposit a barrier layer over a feature with few or no resulting surface defects or feature deformation. During deposition, the barrier layer material may overloaf, that is, deposit excess material on the shoulders of a via and deposit too little material in the base of the via, forming a shape that looks like the side of a loaf of bread. The phenomena is also known as footing because the base of the via has a profile that looks like a foot. In extreme cases, the shoulders of a via may merge to form a joined, sealed surface across the top of the via. The non-uniformity of film thickness across the wafer can negatively impact the drive current improvement from one device to another. Modulating the process parameters alone does not significantly improve the step coverage and pattern loading problems.

Therefore, a need exists for a method of depositing conformal films over formed features in a patterned substrate.

SUMMARY OF THE INVENTION

Embodiments of the present invention provide a method of controlling the step coverage and pattern loading of a layer on a substrate. In one embodiment, the method comprises placing a substrate with at least one formed feature across a surface of the substrate into a chamber. A dielectric layer is deposited on the substrate, and the dielectric layer is etched with a plasma from oxygen or a halogen-containing gas selected from the group consisting of fluorine, chlorine, bromine, and combinations thereof to provide a desired profile of the dielectric layer on the at least one formed feature.

In another embodiment, the method comprises placing a substrate with at least one formed feature across a surface of the substrate into a chamber and depositing a dielectric layer on the substrate. The feature comprises a top surface, a sidewall surface, and a bottom surface. The dielectric layer is deposited to a greater thickness on the top surface than on the bottom surface and sidewall surface. The dielectric layer is then etched with a plasma from oxygen or a halogen-containing gas selected from the group consisting of fluorine, chlorine, bromine, and combinations thereof. The dielectric layer is etched at a higher rate on the top surface than on the sidewall surface and bottom surface. The depositing and etching of the dielectric layer is repeated for one or more times to provide a desired profile of the dielectric layer on the at least one formed feature.

In a further embodiment, the method comprises placing a substrate with at least one formed feature across a surface of the substrate into a chamber and depositing a silicon nitride dielectric layer on the substrate. The feature comprises a top surface, a sidewall surface, and a bottom surface. The silicon nitride dielectric layer is deposited to a greater thickness on the top surface than on the bottom surface and sidewall surface. The silicon nitride dielectric layer is then etched with a $NF_3$ plasma at a higher etch rate on the top surface than on the sidewall surface and bottom surface to provide a desired profile of the silicon nitride dielectric layer on the at least one formed feature. The depositing and etching of the silicon nitride dielectric layer may be repeated for one or more times to provide the desired profile.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method and apparatus for depositing a conformal dielectric layer over a formed feature. Films that can benefit from this process include dielectric materials such as silicon oxide, silicon oxynitride, or silicon nitride films that may be used as spacers or etch stop layers, for example. The films may be carbon doped, hydrogen doped, or contain some other chemical or element to tailor the dielectric properties. The film may be carbon doped or nitrogen doped. For example, the films may be SiCN, SiOC, SiOCN, SiBN, SiBCN, SiC, BN, or BCN films. In one aspect, a combination of thin layers that have been individually deposited and plasma treated provide a more conformal dielectric layer than a single thick dielectric layer. The chambers that may be used for the processes described herein include the PRODUCER® P3 chamber, PRODUCER® APF™ PECVD chamber, PRODUCER® BLACK DIAMOND® PECVD chamber, PRODUCER® BLOK® PECVD chamber, PRODUCER® DARC PECVD chamber, PRODUCER HARP chamber, PRODUCER® PECVD chamber, PRODUCER SACVD chamber, PRODUCER® SE STRESS NITRIDE PECVD chamber, and PRODUCER® TEOS FSG PECVD chamber, each of which are commercially available from Applied Materials, Inc. of Santa Clara, Calif. The chambers may be configured individually, but are most likely part of an integrated tool. The processes may be performed on any substrate, such as a 200 mm or 300 mm substrate or other medium suitable for semiconductor or flat panel display processing. The processing conditions described below are provided with respect to a PRODUCER® SE STRESS NITRIDE PECVD chamber, which has two isolated processing regions. Thus, the flow rates experienced per each substrate processing region are half of the flow rates into the chamber.

Figure 1:
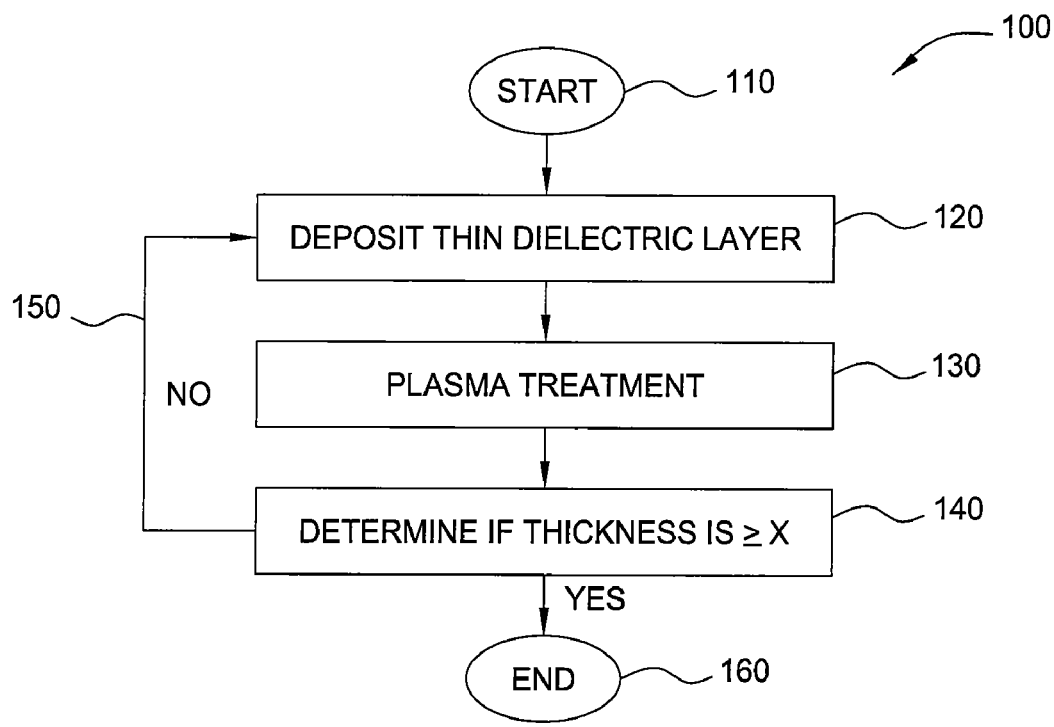
FIG. 1 is a flow chart of an embodiment of a deposition process.

FIG. 1 is a flow chart of an embodiment of a deposition process 100. All of the process steps of deposition process 100 may be performed in the same chamber. The process 100 begins with start step 110 that includes placing a substrate with at least one formed feature across its surface into a chamber. The formed feature may be any type of formed feature such as a via, interconnect, or gate stack. Next, a dielectric layer is deposited by CVD or PECVD during thin dielectric layer deposition step 120. The thin dielectric layer may be silicon oxide, silicon oxynitride, or silicon nitride layer, for example. The layer may be carbon doped or nitrogen doped. The thin dielectric layer may have a thickness of about 1 Å to about 8 Å. The pressure of the chamber is about 100 mTorr to about 8 Torr, and 2 to 8 Torr is preferred. The thin dielectric layer is deposited during deposition step 120 for about 2 to about 5 seconds and then the thin dielectric layer is plasma treated during step 130. The plasma treatment step 130 may include using an inert gas or a reactive gas. The thickness of the deposited layers is next analyzed or estimated during thickness determination step 140. If the thickness of the deposited layer or layers is equal to or greater than a given desired thickness, the process 100 is completed during step 160. During end step 160 the substrate undergoes additional processing and is removed from the chamber. If the thickness is not equal to or greater than a given desired thickness, then the deposition step 120 and plasma treatment step 130 are repeated during repeat process 150. The thickness determination step 140 and repeat process 150 may be repeated multiple times until the desired film thickness is obtained, for example, about 1 to about 6 repetitions may be performed.

FIG. 1 is a generalization to provide a framework for the individual processes illustrated by FIGS. 2 and 6-8. The process steps that are similar to FIG. 1 have identical reference numerals in FIGS. 2 and 6-8. However, slight process modifications may be appropriate.

Figure 2:
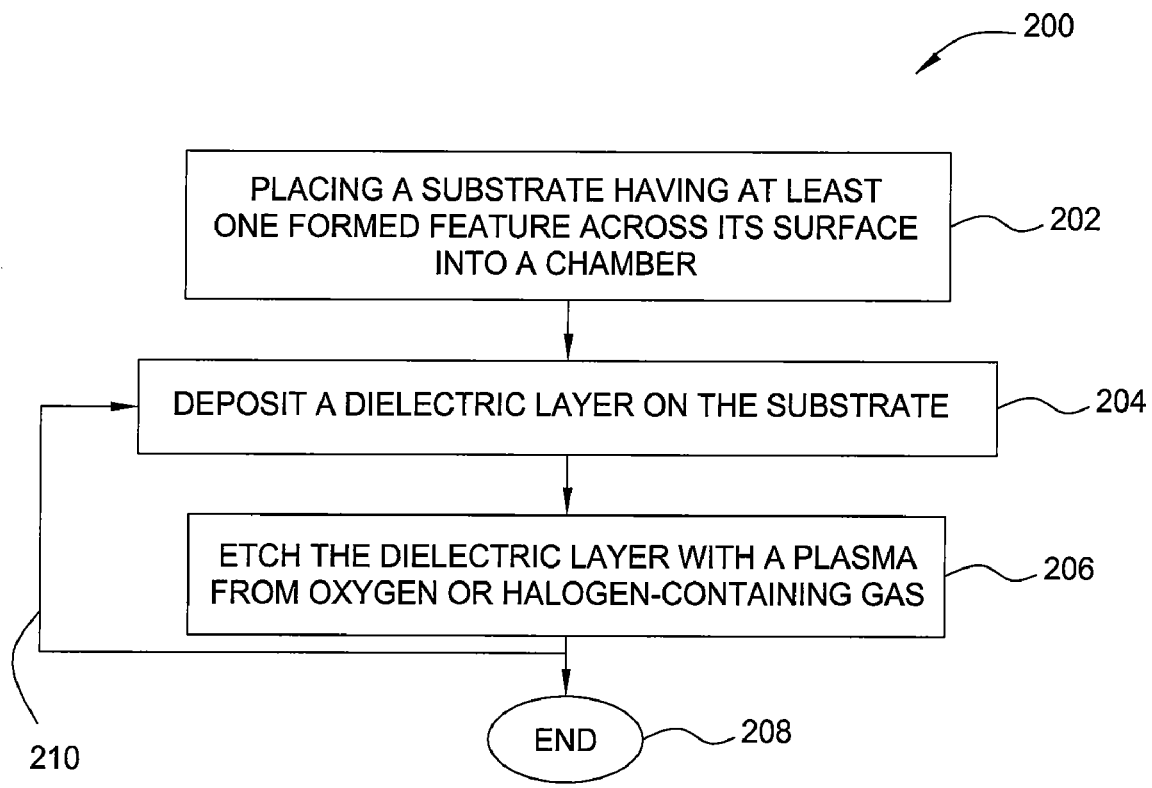
FIG. 2 is a flow chart of an additional embodiment of a deposition process.

FIG. 2 is a flow chart of an embodiment of a deposition process 200. A substrate having at least one formed feature across its surface is placed into a chamber, as shown in step 202. The feature has a top surface, a sidewall surface, and a bottom surface. A dielectric layer is deposited on the substrate, as shown in step 204. The dielectric layer may be deposited by CVD or PECVD. The dielectric layer may be a silicon nitride, silicon oxide, or silicon oxynitride layer, for example. Alternatively, the layer may be any of the carbon or nitrogen-doped films described above. Typically, the deposition of the dielectric layer provides a greater thickness of the dielectric layer on the top surface than on the bottom surface and the sidewall surface. Then, the dielectric layer is etched with a plasma from oxygen or a halogen-containing gas, as shown in step 206. The halogen-containing gas is selected from the group consisting of fluorine, chlorine, bromine, and combinations thereof. An oxygen plasma may be provided by oxygen gas ($O_2$) or other oxygen-containing gases. Optionally, although not shown, the thickness of the dielectric layer may be then analyzed or estimated during a thickness determination step as described above with respect to FIG. 1. If the etching of the dielectric layer in step 206 provides a desired profile of the dielectric layer on the at least one formed feature, the process is ended in step 208. The desired profile may be a conformal or substantially conformal profile which has less thickness variation among the sidewall, top, and bottom surfaces of the feature than after the deposition of the dielectric layer and prior to the etching. In other words, the desired profile has an improved step coverage, i.e., a lower percentage of film thickness difference between different surfaces of a feature. If the etching of the dielectric layer in step 206 does not provide a desired profile of the dielectric layer on the at least one formed feature, a repeat step 210 may be performed. The repeat step 210 includes deposition of an additional amount of the dielectric layer and then etching the dielectric layer. The repeat step 210 may be performed several times, such as between one and 100 times, e.g., between one and six times, to obtain a desired profile of the dielectric layer on the at least one formed feature.

Returning to step 206, the dielectric layer may be etched in the same chamber in which the dielectric layer is deposited or in a different chamber that is part of the same integrated tool as the deposition chamber and is connected to the deposition chamber by a transfer chamber of the integrated tool. The oxygen or halogen-containing gas may be introduced into the chamber individually or in combination with an inert gas, such as argon or helium. The etch step 206 is performed using a plasma that is generated remotely or in situ. The length of the etch step 206 may be at least 0.1 seconds, such as between about 0.1 seconds and about 45 seconds, e.g., between about 15 seconds and about 45 seconds. The etch profile can be configured to match the deposition profile by adjusting the halogen-containing gas flow rate and length of exposure. For example, the etch rate may be higher on the top surface of the feature than on the sidewall surface or bottom surface of the feature. Typically, the etch rate on the top surface is about 10% higher than the etch rate on the sidewall surface or the bottom surface. In some instances, an etch rate of about 50 percent may be desirable. As defined herein, an etch rate of about 50 percent corresponds to an etch process that removes about 50 percent of the thickness of the dielectric layer that is deposited. Also, deposition step 204 may alternatively be a two part deposition process, such as two seconds of plasma at a first power and precursor partial pressure and two additional seconds at a second power and second precursor partial pressure.

In embodiments in which the etch step 206 is performed using a plasma that is remotely generated, the plasma may be produced by exposing oxygen or a halogen-containing gas selected from the group consisting of fluorine, chlorine, bromine, and combinations thereof to microwave energy in a remote plasma source that is connected to the chamber in which the dielectric layer is deposited. For example, the plasma may be generated from $NF_3$, which provides reactive fluorine species. The $NF_3$ may be introduced into the chamber at a flow rate between about 10 sccm and about 20 slm. The $NF_3$ may be introduced into the chamber with argon or helium as a dilution gas. The argon and helium may also help sustain the plasma in the chamber. The argon or helium may be introduced into the chamber at a flow rate between about 100 sccm and about 20 slm. The pressure in the chamber during the etch may be between about 10 mTorr and about 760 Torr, and the temperature of a substrate support in the chamber may be set to between about 100° C. and about 650° C.

In embodiments in which the etch step 206 is performed using a plasma that is generated in situ, i.e., in the chamber, the plasma may be generated by RF power. The RF power may be provided at a high frequency, such as between about 1 MHz and about 13.56 MHz, e.g., about 2 MHz to about 13.56 MHz, a low frequency between about 100 kHz and about 1 MHz, e.g., between about 100 kHz and about 400 kHz, or a mixed frequency comprising a frequency between about 1 MHz and about 13.56 MHz, e.g., about 2 MHz to about 13.56 MHz, a low frequency between about 100 kHz and about 1 MHz, e.g., between about 100 kHz and about 400 kHz. The halogen-containing gas that is selected from the group consisting of fluorine, chlorine, bromine, and combinations thereof and is used as an etching gas may be $NF_3$, or a carbon and fluorine-containing gas, such as $CF_4$ or $C_4F_8$. The oxygen or halogen-containing gas may be introduced into the chamber at a flow rate between about 10 sccm and about 20 slm. The oxygen or halogen-containing gas may be introduced into the chamber with argon or helium as a dilution gas. The argon and helium may also help sustain the plasma in the chamber. The argon or helium may be introduced into the chamber at a flow rate between about 100 sccm and about 20 slm. The pressure in the chamber during the etch may be between about 10 mTorr and about 760 Torr, and the temperature of a substrate support in the chamber may be set to between about 100° C. and about 650° C. The spacing between a showerhead electrode and a substrate support electrode in the chamber may be between about 100 mils and about 3000 mils. The spacing may be adjusted to control the stability of the plasma.

Embodiments of the invention include process sequences in which a single deposition step 204 and a single etching step 206 are performed and process sequences that include a repeat step 210 with multiple deposition and etching steps. A process sequence comprising a single deposition step and a single etching step may be performed for a dielectric layer that has a high etch rate on a sidewall surface of a feature of the dielectric layer relative to the etch rate on a top surface of a feature of the dielectric layer. For example, the etch rate on the sidewall surface may be at least about 10% of the rate at which the dielectric layer is etched from the top surface. Dielectric deposition processes that provide a lower ion bombardment on the sidewalls of features than on the top or bottom of features can result in higher etch rates of the dielectric on the sidewall rather than on the bottom or top of features.

By keeping the thickness of the etched material constant for different thickness of deposited dielectric layers and thus varying the percent of the dielectric layers that was etched, it was found that the bottom pattern loading effect for process sequences comprising a single deposition step and a single etching step was independent of the thickness of the deposited dielectric layer for dielectric layers having a thickness of up to 1000 Å.

A process sequence comprising multiple deposition and etching steps may be performed for a dielectric layer that has a low etch rate on a sidewall surface of a feature of the dielectric layer relative to the etch rate on a top surface of a feature of the dielectric layer. For example, the etch rate on the sidewall surface may be less than about 10% of the rate at which the dielectric layer is etched from the top surface. The etch rates may be determined by measuring the thickness of the dielectric layer at the bottom, sidewall, and top of a feature using SEM or TEM cross-sections before and after the dielectric layer is etched and calculating the thickness etched per the time period of the etch. Increasing the number of deposition and etching cycles may improve the pattern loading effect.

In an exemplary embodiment, a process sequence comprising two or three deposition and etching cycles may be performed for dielectric layers for use as etch stop liners for features sites of 90 nm and below. The dielectric layer may be deposited to a thickness of between about 300 Å and about 400 Å in each cycle, and a thickness of between about 100 Å and about 200 Å of the dielectric layer may be etched in each cycle.

Figure 3A:
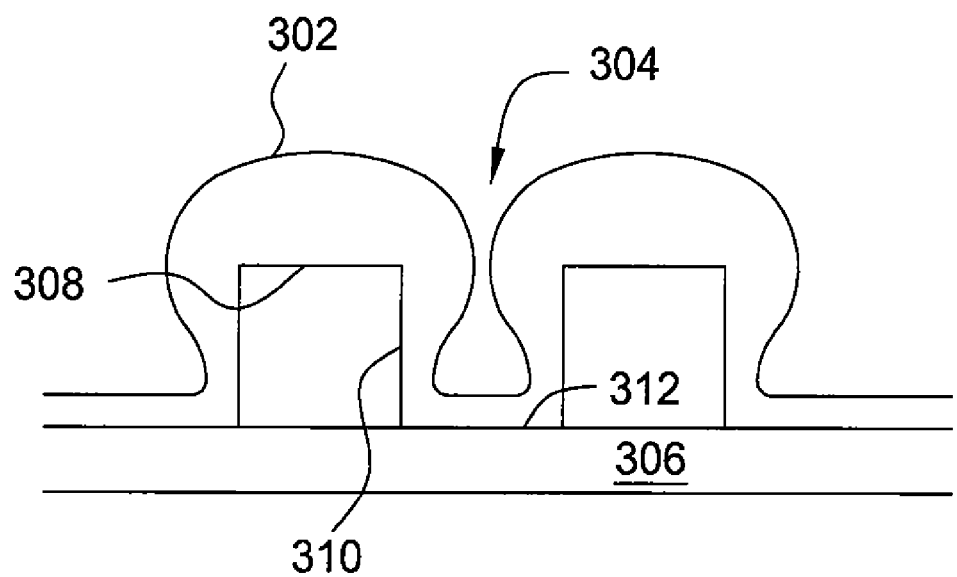
FIG. 3A is a sketch of a dielectric layer profile on a feature of a substrate according to the prior art.
Figure 3B:
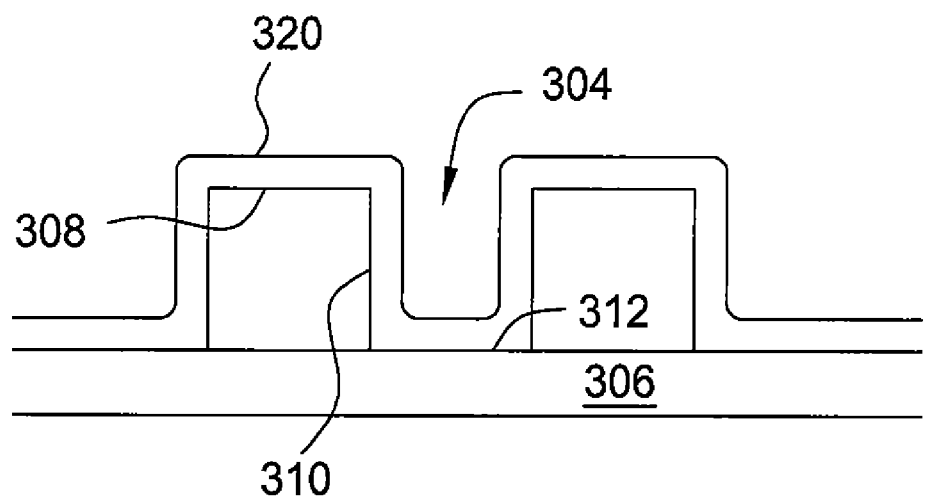
FIG. 3B is a sketch of a dielectric layer profile on a feature of a substrate according to an embodiment of the invention.

Experimental testing of embodiments of the invention shows that the etch profile can be controlled to match the deposition profile, that is, to provide a higher etch rate across the top surface of formed features than at the bottom or along the sidewalls of the formed feature. FIG. 3A is a sketch of a SEM of a dielectric layer 302 formed on a feature 304 of a substrate 306 according to the prior art. The dielectric layer has a non-uniform profile with a greater thickness of the top 308 of the feature than on the sidewall 310 and bottom 312 of the feature. FIG. 3B is a sketch of a SEM of a dielectric layer 320 formed on a feature 304 according to an embodiment of the invention. The dielectric layer 320 has a more uniform profile on the feature 304 than the dielectric layer 302.

Scanning electron microscopy photographs of a cross section of formed features also show that an $NF_3$ plasma etch for 45 seconds comprising 50 sccm of $NF_3$, 3 L of argon, 100 W of low frequency RF power at 350 kHz, a chamber pressure of 1.5 Torr, and a spacing of 1000 mils can reduce the bottom pattern loading effect (PLE) of a silicon nitride dielectric layer by about 30 percent (from a PLE of 67% to 41%) and that such etch processes can be used to modulate the step coverage for other dielectric film deposition processes. The film stress was not affected by the etch process. The sidewall loading was reduced from 46% to 33%, and the top loading was reduced from 10% to 3%. As the pattern loading effect is measured as the percentage of film thickness difference between a film thickness on portion, such as the bottom, top, or sidewall, of a feature in a substrate region with a few features (an isolated area) and a film thickness on a corresponding portion of a feature in a substrate region with high density of features (a dense area), a lower pattern loading effect percentage reflects a higher film thickness uniformity across a substrate.

Figure 4:
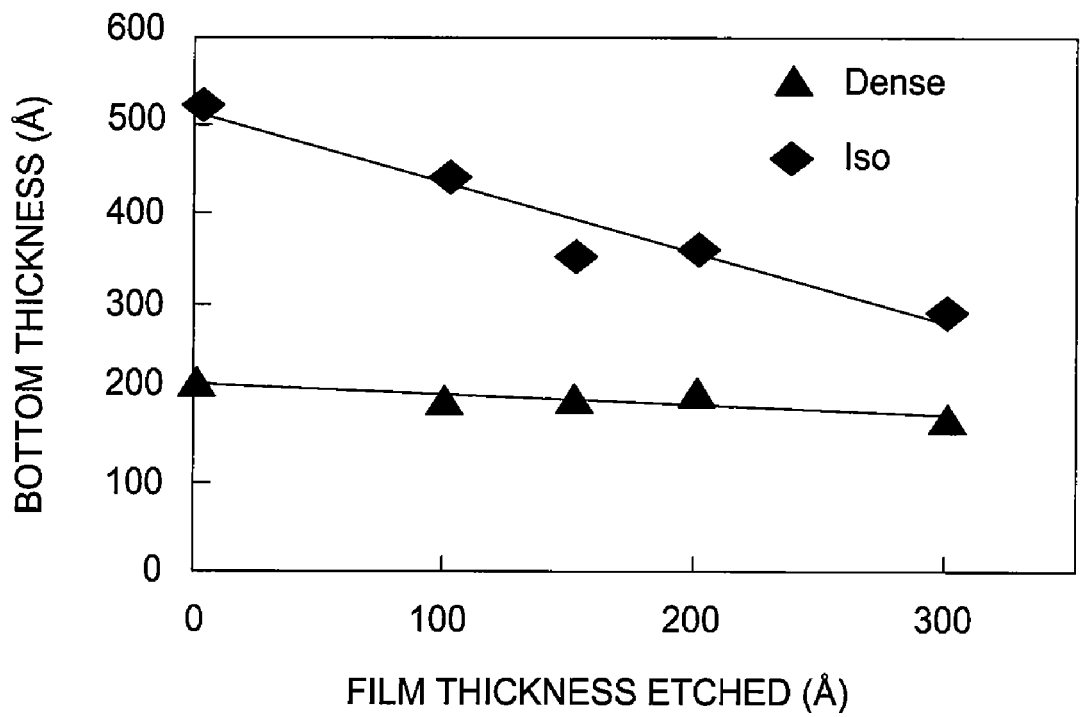
FIG. 4 is a graph showing the resulting bottom thickness for features in dense and isolated regions of a substrate for different etched film thicknesses according to an embodiment of the invention.
Figure 5:
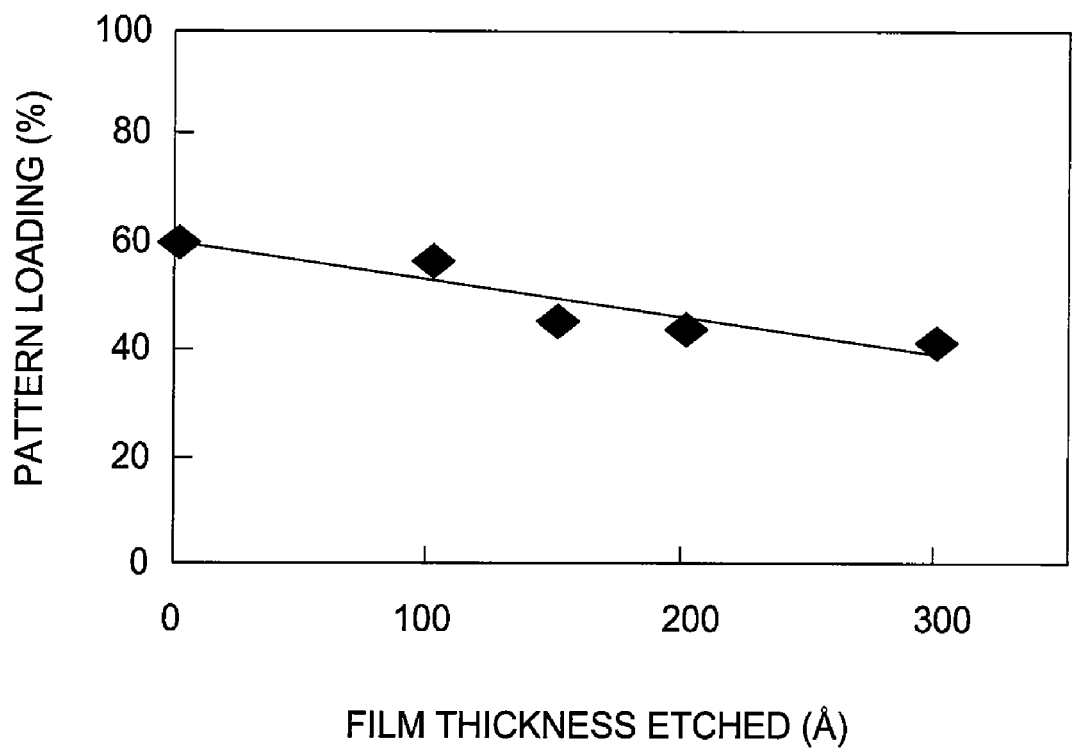
FIG. 5 is a graph showing the resulting bottom pattern loading effect for different etched film thicknesses according to an embodiment of the invention.

FIGS. 4 and 5 show the effect of the length of the etch period, as reflected by the film thickness etched, on the bottom dielectric layer thickness for substrates with isolated (iso) and dense feature spacings and the pattern loading effect respectively for $NF_3$ etches using 50 sccm of $NF_3$, 3 L of argon, 100 W of low frequency RF power at 350 kHz, a chamber pressure of 1.5 Torr, and a spacing of 1000 mils. Etch periods of 15-45 seconds were used, which corresponded to 100 Å to 300 Å of etched film thickness. The bottom pattern loading effect improved significantly, i.e., about 30%, with the longer etch period.

A comparison of pattern loading and bottom thickness as a function of the type of etch was performed using $NF_3$ as the fluorine-containing etching gas on a silicon nitride dielectric layer. No etch, a low frequency RF plasma etch at 100 W, a high frequency RF plasma etch at 50 W, and a remote plasma source etch were compared for a process sequence comprising depositing 400 Å of a silicon nitride dielectric layer, etching 200 Å of the silicon nitride dielectric layer, and then depositing 450 Å of the silicon nitride dielectric layer. The low frequency RF plasma etch and the high frequency RF plasma etch provided similar pattern loading effect results, while the remote plasma source etch resulted in a greater pattern loading effect and an etch rate uniformity of more than 20 percent. It is believed that the RF plasma in situ etching methods are more efficient in providing an etch profile that is similar to the deposition profile, i.e., higher etch rates on the top surface of features and slower etch rates on the sidewall surface of features, than remote plasma etching methods as the etching species are accelerated toward the substrate surface directionally by the sheath voltage in in situ RF methods while the etching profile is more isotropic in remote plasma etching methods.

While the embodiment of FIG. 2 has been described primarily with respect to SiN layers, the embodiment of FIG. 2 may also be used for other dielectric layers, such as SiO, SiN, SiCN, SiOC, SiOCN, SiBN, SiBCN, SiC, BN, or BCN layers. For layers comprising carbon, the etch step 206 includes an oxygen-containing gas that provides reactive oxygen species that etch carbon-containing layers and a halogen-containing gas. The halogen-containing gas and the oxygen-containing gas may be used simultaneously or sequentially. For example, the layer may be exposed to a plasma of an oxygen-containing gas and then a plasma of a halogen-containing gas.

Figure 6:
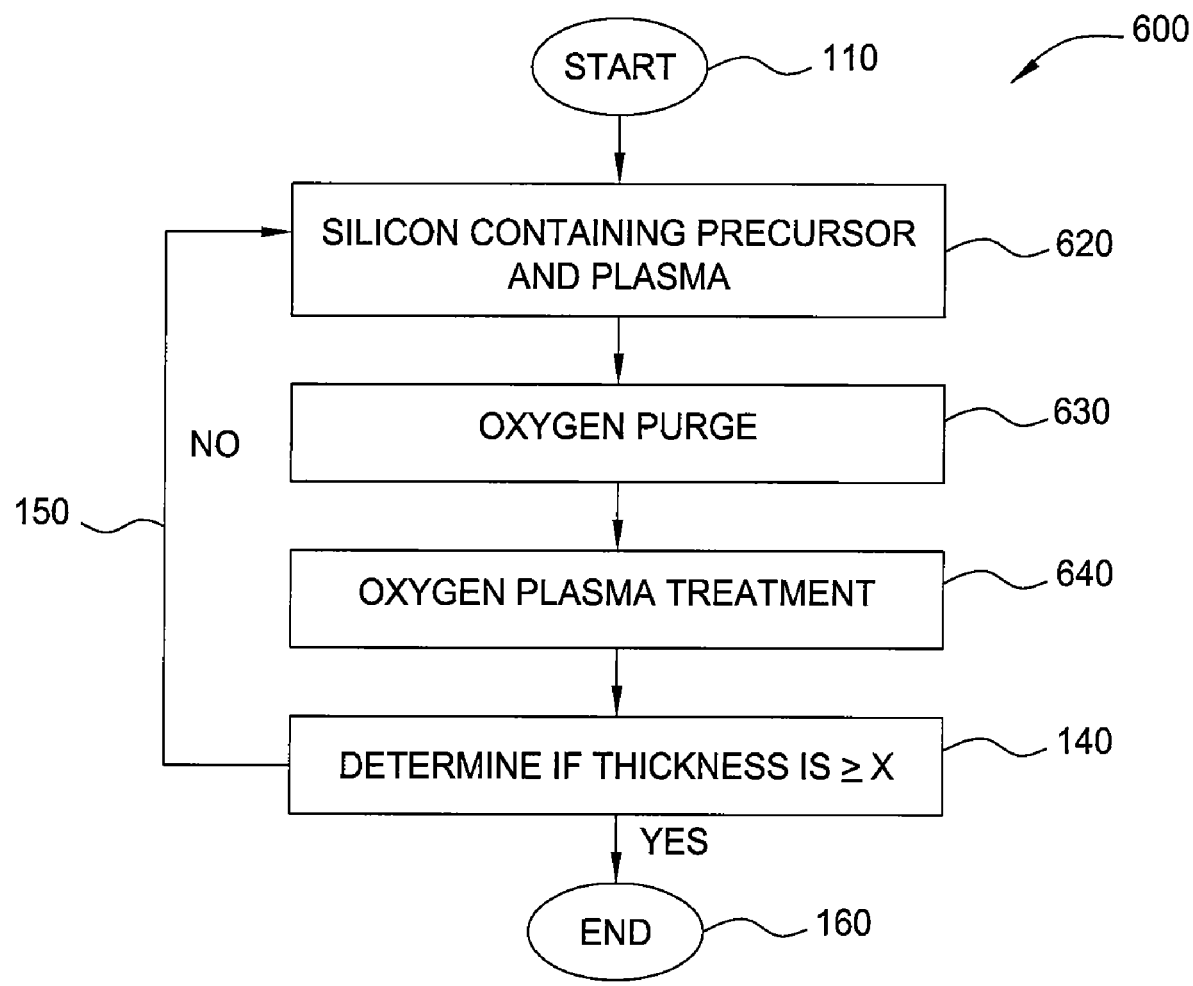
FIG. 6 is a flow chart of an additional embodiment of a deposition process.

FIG. 6 is a flow chart of an embodiment of a deposition process 600. The start step 110, the thickness determination step 140, the repeat step 150, and the end step 160 are described above. Depositing a dielectric is performed by exposing the substrate to a silicon containing precursor simultaneously with plasma present in the chamber during precursor and plasma step 620. The silicon containing precursor can include octamethylcyclotetrasiloxane (OMCTS), methyldiethoxysilane (MDEOS), bis t-butylaminosilane (BTBAS), tridimethylaminosilane (TriDMAS), trisdimethylaminosilane (TrisDMAS), silane, disilane, dichlorosilane, trichlorosilane, dibromosilane, silicon tetrachloride, and silicon tetrabromide. OMCTS and silane are the preferred silicon containing precursors. The plasma is provided with the precursor at about 50 W to about 400 W. The gases optionally introduced into the chamber at the same time as the silicon containing precursor include helium, nitrogen, oxygen, nitrous oxide, and nitric oxide. Oxygen and/or helium are the preferred additional gases for introduction to the chamber if an additional gas is needed.

The plasma and precursor and optional additional gases introduced during step 620 are followed by the introduction of oxygen gas to the chamber during oxygen purge step 630. The oxygen purge step 630 is performed by introducing oxygen or nitrous oxide into the chamber at a time period and partial pressure that is selected to purge the residual silicon containing precursor and optional additional gases. Next, during oxygen plasma treatment step 640, an oxygen-containing gas such as oxygen or nitrous oxide is introduced into the chamber. The plasma is provided at about 50 W to about 400 W for about 0.1 seconds to about 20 seconds.

Experimental tests of a process similar to FIG. 6 using OMCTS and helium as the silicon containing precursor were performed. The film deposition rate and ratio of methyl groups to oxygen groups present in the resulting film was plotted as a function of plasma power. The deposition rate reached a plateau at about 300 W and the deposition rate was lowest at about 400 W when RF power of 0 to 400 W was observed. Scanning electron microscope images confirm that the process of FIG. 6 provides improved step coverage and reduced pattern loading than those processes that do not use a combined oxygen purge and oxygen plasma treatment.

Several combinations of helium and OMCTS were tested to determine the best ratio for developing a dielectric layer. A ratio of about twice as much helium to OMCTS as the silicon containing precursor and additional gas yielded a film with the greatest film thickness. Also, scanning electron micrographs of a film deposited with OMCTS, a film deposited with OMCTS and oxygen plasma at 90 mTorr, and a film deposited with OMCTS and oxygen plasma at 2 Torr indicate that the film deposited with OMCTS and oxygen plasma at 2 Torr provides the best pattern loading effect and step coverage of the three films.

Nitrous oxide and oxygen were compared for use in the oxygen plasma treatment step 640. Scanning electron micrographs of a film deposited using nitrous oxide and a film deposited using oxygen indicate that the film deposited using oxygen had the better pattern loading effect and step coverage of the two films.

Figure 7:
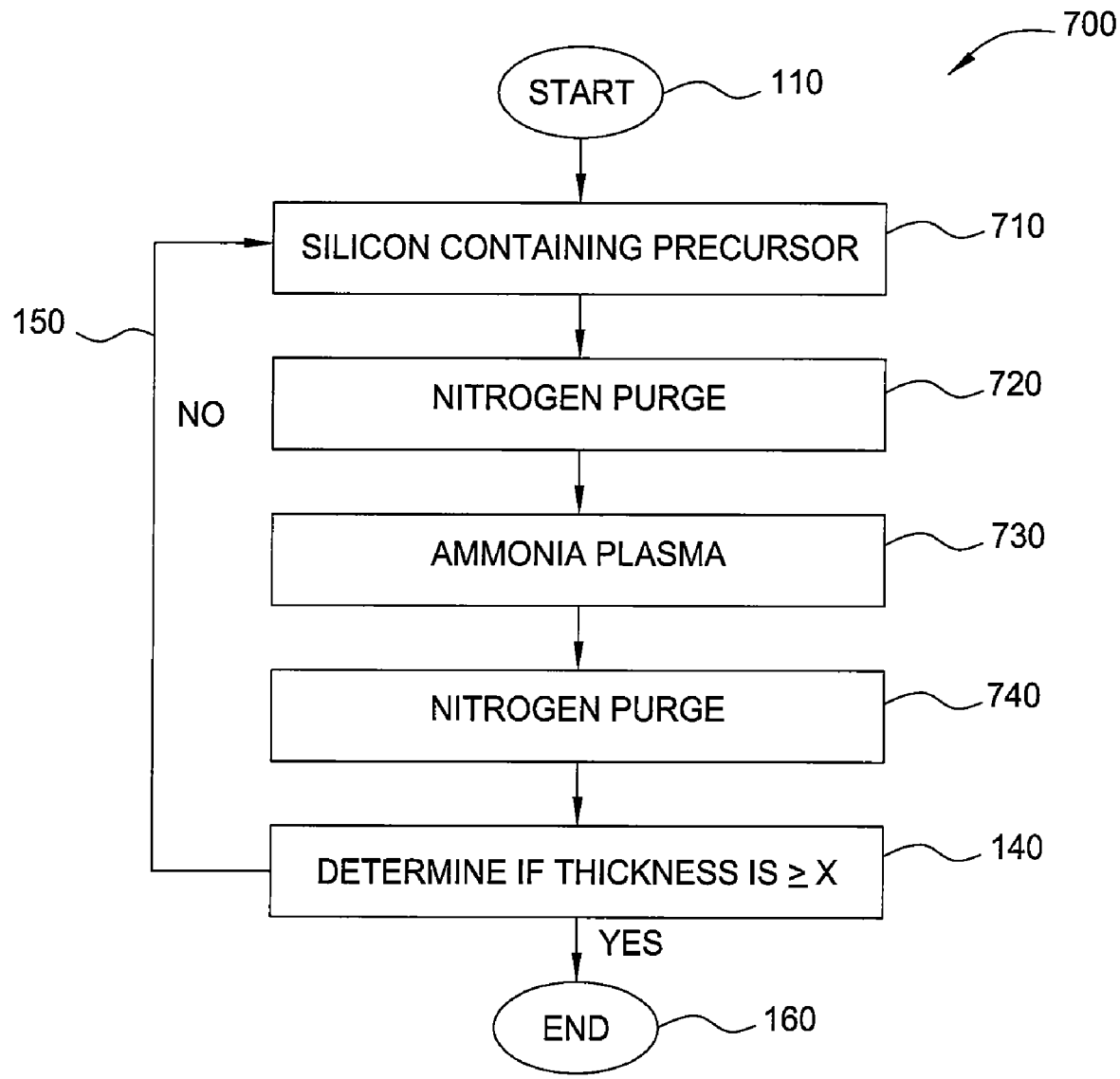
FIG. 7 is a flow chart of an additional embodiment of a deposition process.

FIG. 7 is a flow chart of an embodiment of a deposition process 700. The start step 110, the thickness determination step 140, the repeat step 150, and the end step 160 are described above. During deposition step 710, a silicon-containing precursor is introduced into the chamber. The silicon-containing precursor can include octamethylcyclotetrasiloxane (OMCTS), methyldiethoxysilane (MDEOS), bis t-butylaminosilane (BTBAS), tridimethylaminosilane (TriDMAS), trisdimethylaminosilane (TrisDMAS), silane, disilane, dichlorosilane, trichlorosilane, dibromosilane, silicon tetrachloride, and silicon tetrabromide. Silane is the preferred precursor for deposition process 700. The deposition step 710 may be performed for about 2 to about 5 seconds. Next, during step 720, nitrogen is introduced into the chamber. Then, during step 720, ammonia is used to provide plasma to the chamber. Then, during step 740, another nitrogen purge is performed. The time for one cycle of steps 710 to 140 is about 60 seconds per cycle and the deposition rate is about 2 Å per cycle. The process 700 has conformal coverage that is controlled by the purge efficiency, that is, how effectively the purge removes silicon containing precursor before the ammonia plasma.

Figure 8:
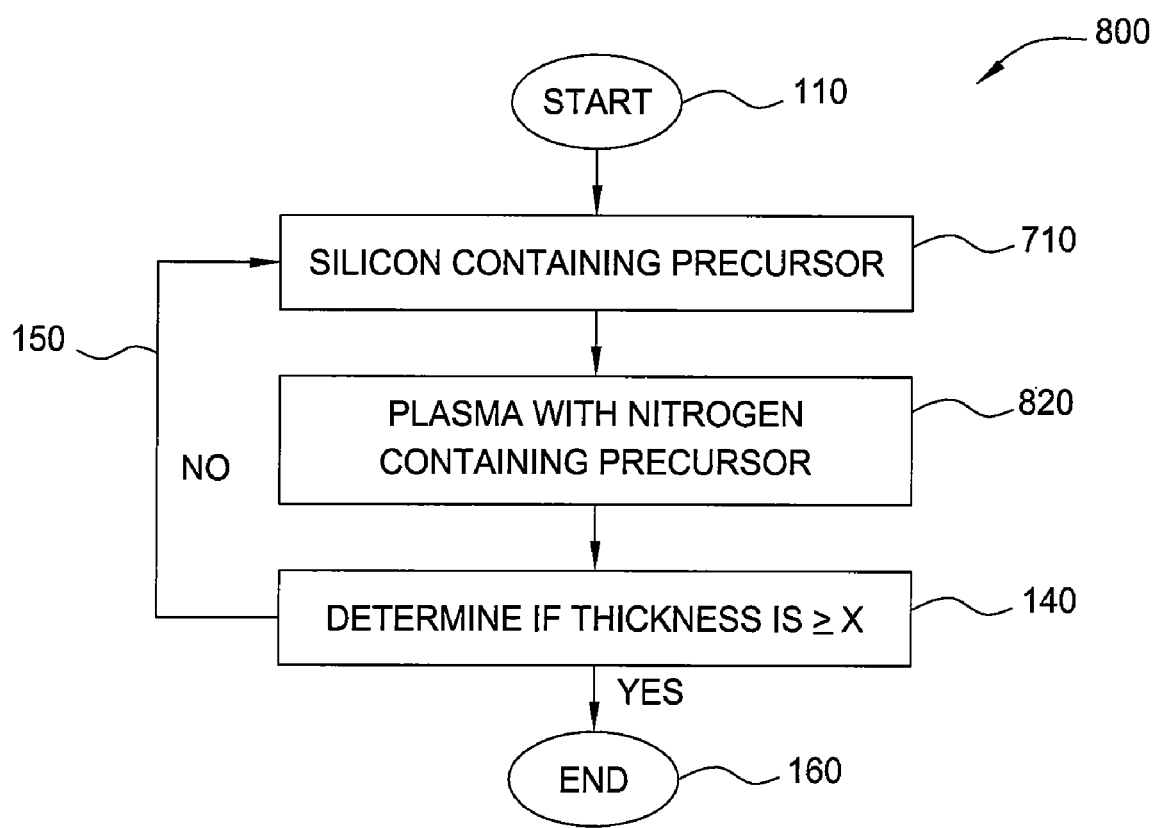
FIG. 8 is a flow chart of an additional embodiment of a deposition process.

FIG. 8 is a flow chart of an additional embodiment of a deposition process 500. The start step 110, the thickness determination step 140, the repeat step 150, the end step 160, and silicon-containing precursor step 710 are described above. After silicon-containing precursor step 710, an optional nitrogen purge step (not shown) may be performed. Next, during plasma step 820, plasma with a nitrogen-containing precursor is introduced to the chamber. The nitrogen-containing precursor may include nitrogen, ammonia, or nitrous oxide. Ammonia is the preferred nitrogen containing precursor. The time for one cycle of steps 710 to 140 is about 30 seconds for deposition process 500. The deposition rate is about 3.5 Å per cycle.

The advantage of the processes described above is that they result in films with improved step coverage and pattern loading. The process cycles that can be performed in the same chamber require less processing time than processes requiring multiple chambers. The overall thermal budget and individual substrate process temperatures are lower than in processes that do not use plasma.

While the foregoing is directed to embodiments of the present invention, other and further embodiments of the invention may be devised without departing from the basic scope thereof, and the scope thereof is determined by the claims that follow.

What is claimed is:

1. A method of controlling the step coverage and pattern loading of a layer on a substrate, comprising:
    placing a substrate with at least one formed feature comprising a top surface, a sidewall surface, and a bottom surface across a surface of the substrate into a chamber;
    depositing a dielectric layer on the substrate to a greater thickness on the top surface than on the bottom surface and sidewall surface; and
    etching the dielectric layer with a plasma from oxygen or a halogen-containing gas selected from the group consisting of fluorine, chlorine, bromine, and combinations thereof, at a higher etch rate on the top surface than on the bottom surface and the sidewall surface to provide a desired profile of the dielectric layer on the at least one formed feature.

2. The method of claim 1, wherein the depositing a dielectric layer and the etching the dielectric layer with a plasma are performed in the same chamber.

3. The method of claim 1, wherein the etch rate of the dielectric layer on the top surface is at least 10% higher than the etch rate of the dielectric layer on the sidewall surface or the bottom surface.

4. The method of claim 1, wherein the plasma is generated by RF power in the chamber.

5. The method of claim 4, wherein the RF power has a single frequency between about 100 kHz and about 1 MHz.

6. The method of claim 4, wherein the RF power has a single frequency between about 1 MHz and about 13.56 MHz.

7. The method of claim 4, wherein the RF power comprises a first frequency between about 100 kHz and about 1 MHz and a second frequency between about 1 MHz and about 13.56 MHz.

8. The method of claim 1, wherein the plasma is generated by a remote plasma source.

9. The method of claim 1, wherein the depositing a dielectric layer and the etching the dielectric layer are performed in separate chambers that are connected by a transfer chamber.

10. A method of controlling the step coverage and pattern loading of a layer on a substrate, comprising:
    placing a substrate with at least one formed feature across a surface of the substrate into a chamber, wherein the feature comprises a top surface, a sidewall surface, and a bottom surface;
    depositing a dielectric layer on the substrate, wherein the dielectric layer is deposited to a greater thickness on the top surface than on the bottom surface and sidewall surface;
    etching the dielectric layer with a plasma from oxygen or a halogen-containing gas selected from the group consisting of fluorine, chlorine, bromine, and combinations thereof at a higher etch rate on the top surface than on the sidewall surface and bottom surface; and
    repeating the depositing a dielectric layer and the etching the dielectric layer with a plasma to provide a desired profile of the dielectric layer on the at least one formed feature.

11. The method of claim 10, wherein the depositing a dielectric layer and the etching the dielectric layer are performed in the same chamber or in separate chambers that are connected by a transfer chamber.

12. The method of claim 10, wherein the etch rate of the dielectric layer on the top surface is at least 10% higher than the etch rate of the dielectric layer on the sidewall surface or the bottom surface.

13. The method of claim 10, wherein the repeating of the depositing a dielectric layer and the etching the dielectric layer with a plasma is performed between 1 and 100 times.

14. The method of claim 10, wherein the dielectric layer is a SiO, SiN, SiCN, SiOC, SiOCN, SiBN, SiBCN, SiC, BN, or BCN layer.

15. The method of claim 10, wherein the etching the dielectric layer occurs for at least about 0.1 seconds.

16. A method of controlling the step coverage and pattern loading of a layer on a substrate, comprising:
    placing a substrate with at least one formed feature across a surface of the substrate into a chamber, wherein the feature comprises a top surface, a sidewall surface, and a bottom surface;
    depositing a silicon nitride dielectric layer on the substrate wherein the silicon nitride dielectric layer is deposited to a greater thickness on the top surface than on the bottom surface and sidewall surface; and
    etching the silicon nitride dielectric layer with a $NF_3$ plasma at a higher etch rate on the top surface than on the sidewall surface and bottom surface to provide a desired profile of the silicon nitride dielectric layer on the at least one formed feature.

17. The method of claim 16, wherein the etch rate of the dielectric layer on the top surface is at least 10% higher than the etch rate of the dielectric layer on the sidewall surface or the bottom surface.

18. The method of claim 16, wherein the $NF_3$ plasma is generated by RF power in the chamber.

19. The method of claim 16, wherein the etching the silicon nitride dielectric layer occurs for about 0.1 seconds to about 45 seconds.

* * * * *